US 11,560,618 B2

United States Patent
Raab et al.

(10) Patent No.: US 11,560,618 B2
(45) Date of Patent: Jan. 24, 2023

(54) AL—CR-BASED CERAMIC COATINGS WITH INCREASED THERMAL STABILITY

(71) Applicant: Oerlikon Surface Solutions AG, Pfäffikon, Pfäffikon (CH)

(72) Inventors: Robert Raab, Vienna (AT); Christian Martin Koller, Trofaiach (AT); Paul Heinz Mayrhofer, Neckenmarkt (AT); Mirjam Arndt, Bad Ragaz (CH); Jürgen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 156 days.

(21) Appl. No.: 16/765,685

(22) PCT Filed: Nov. 23, 2018

(86) PCT No.: PCT/EP2018/082363
§ 371 (c)(1),
(2) Date: May 20, 2020

(87) PCT Pub. No.: WO2019/101919
PCT Pub. Date: May 31, 2019

(65) Prior Publication Data
US 2020/0299823 A1    Sep. 24, 2020

(30) Foreign Application Priority Data
Nov. 24, 2017  (CH) ..................................... 01433/17

(51) Int. Cl.
*C23C 14/06*    (2006.01)
*C23C 14/18*    (2006.01)
(Continued)

(52) U.S. Cl.
CPC ........ *C23C 14/185* (2013.01); *C23C 14/0042* (2013.01); *C23C 14/0641* (2013.01);
(Continued)

(58) Field of Classification Search
CPC ............ C23C 14/0641; C23C 14/0676; C23C 14/185; C23C 28/42
(Continued)

(56) References Cited

U.S. PATENT DOCUMENTS 7,727,621 B2    6/2010 Nordlöf et al.
9,249,515 B2    2/2016 Schier et al.
(Continued)

FOREIGN PATENT DOCUMENTS

CN    1978192 A    6/2007
CN    101175867 A    5/2008
(Continued)

OTHER PUBLICATIONS

Raab et al., Interfaces in arc evaporated Al—Cr—N/Al—Cr—O multilayers and their impact on hardness, Surface and Coatings Technology. vol. 324, Sep. 15, 2017, pp. 236-242.
(Continued)

*Primary Examiner* — Seth Dumbris
(74) *Attorney, Agent, or Firm* — Bret E. Field; Bozicevic, Field & Francis LLP

(57) ABSTRACT

The present invention relates to a method for producing a multilayer film comprising aluminum, chromium, oxygen and nitrogen, in a vacuum coating chamber, the multilayer film comprising layers of type A and layers of type B deposited alternate one of each other, wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, characterized in that: —The A layers
(Continued)

Figure 1:
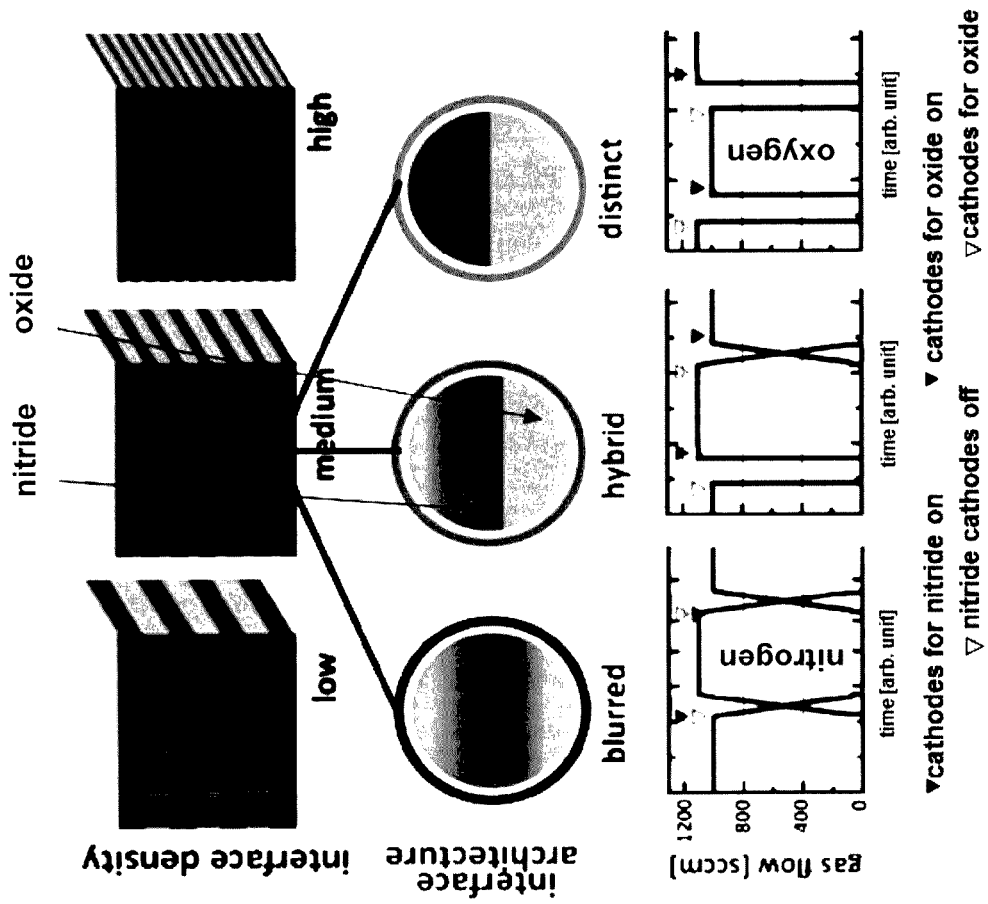

are deposited as oxynitride layers of Al—Cr—O—N by using nitrogen and oxygen as reactive gas at the same time, —The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

23 Claims, 4 Drawing Sheets

(51) Int. Cl.
    *C23C 14/00*     (2006.01)
    *C23C 14/32*     (2006.01)
    *C23C 28/04*     (2006.01)
    *F01D 5/28*     (2006.01)

(52) U.S. Cl.
    CPC ........ *C23C 14/0676* (2013.01); *C23C 14/325* (2013.01); *C23C 28/042* (2013.01); *F01D 5/288* (2013.01); *F05D 2230/313* (2013.01); *F05D 2300/2281* (2013.01)

(58) Field of Classification Search
    USPC ........................................ 428/697, 698, 699
    See application file for complete search history.

(56) References Cited

U.S. PATENT DOCUMENTS

| | | | |
|---|---|---|---|
| 9,997,338 | B2 | 6/2018 | Ramm et al. |
| 10,982,313 | B2 | 4/2021 | Derflinger et al. |
| 2008/0193782 | A1 | 8/2008 | Ramm et al. |
| 2010/0062257 | A1* | 3/2010 | Morstein ............. C23C 14/0641 428/697 |
| 2014/0193637 | A1* | 7/2014 | Schier ..................... C23C 14/35 428/698 |
| 2015/0107544 | A1 | 4/2015 | Lehnert et al. |
| 2016/0060746 | A1* | 3/2016 | Ramm ................ C23C 14/0641 204/192.15 |
| 2016/0138153 | A1 | 5/2016 | Sobiech et al. |
| 2017/0173757 | A1 | 6/2017 | Sobiech et al. |
| 2019/0226075 | A1* | 7/2019 | Derflinger ........... C23C 14/0021 |

FOREIGN PATENT DOCUMENTS

| | | |
|---|---|---|
| CN | 103748256 A | 4/2014 |
| CN | 107287555 A | 10/2017 |
| DE | 102016108734 A1 | 11/2017 |
| JP | 2008-533310 A | 8/2008 |
| WO | WO2011007848 A1 | 1/2011 |
| WO | WO2012095994 A1 | 7/2012 |
| WO | WO2014170005 A2 | 10/2014 |
| WO | WO2014170005 A3 | 3/2015 |

OTHER PUBLICATIONS

International Search Report and Written Opinion for PCT Application No. PCT/EP2018/082363 dated Mar. 13, 2019, 14 pages.
Search Report for Swiss Application No. CH01433/17 dated Feb. 28, 2018, with its English summary, 4 pages.
First Office Action for Chinese Application No. 2018800872139 dated Mar. 22, 2022, with its English summary, 17 pages.
Office Action for Japanese Application No. 2020-528121 dated Nov. 29, 2022, with its English summary, 5 pages.
Office Action for Chinese Application No. 201880087213.9 dated Nov. 22, 2022, with its English summary, 5 pages.

\* cited by examiner

AL—CR-BASED CERAMIC COATINGS WITH INCREASED THERMAL STABILITY

The present invention relates to Al—Cr—O—N-based coatings exhibiting increased thermal stability at high temperatures. The present invention relates furthermore to a method for producing the inventive coatings.

In the context of the present invention the term 'high temperatures' is to be understood as a term for referring to temperatures above 1000° C., in particular 1020° C.

STATE OF THE ART

Aluminum chromium oxide comprising coatings as well as aluminum chromium nitride comprising coatings (also called Al—Cr—O-based coatings and Al—Cr—N-based coatings, respectively) are commonly synthesized by cathodic arc evaporation (hereafter also abbreviated as CAE). These are widely-used materials for coating different kind of tools, e.g. cutting, forming, and milling tools.

These materials are known in particular for exhibiting outstanding thermo-mechanical properties and high wear and oxidation resistance.

However, the current need of a further increase in performance and lifetime of tools and components call for improvements even for already well-established and widely used coating materials.

In machining operations such as dry high-speed cutting, protective coatings ought to withstand temperatures up to 1000° C. or even higher temperatures.

In particular $(Al_xCr_{1-x})N$ coatings exhibiting fcc single phase and an Al mole fraction corresponding to a value that is as possible close to the threshold value of x=0.7 has been found to exhibit a good combination of mechanical properties and thermal stability.

However, during both monolithically grown (i.e. as monolayer) and multi-layered grown of $(Al_xCr_{1-x})N$ coatings by PVD processes, it has been observed that singular fcc phase of $(Al_xCr_{1-x})N$ decomposes into wurtzite phase of aluminum nitride (hereafter also abbreviated as w-AlN) and body centered cubic phase of chromium (hereafter also abbreviated as bcc-Cr), which is formed via release of nitrogen of an intermediately formed hexagonal phase of chromium nitride (hereafter also abbreviated as h-$Cr_2N$).

Such phase transitions, especially when related to large volume changes and mass losses, significantly degrade the coating performance. Therefore it would be desirable to find a possibility of suppressing initiation of such phase transitions at application temperatures or even at higher temperatures.

The chemical combination of Al and Cr with oxygen instead of nitrogen gives rise for entirely different material properties, such as even higher thermal stability and resistivity in oxidizing environments.

$Al_2O_3$ coatings used for improving performance of machining tools are usually produced by chemical vapor deposition (hereafter also abbreviated as CVD) processes conducted at temperatures between 800 and 1000° C. This kind of coatings grow typically exhibiting alfa or kappa structure (hereafter also abbreviated as α- and κ-structure, respectively) and are known to provide excellent wear protection and high hot hardness.

A reduction of the growth temperature of α-$Al_2O_3$ exhibiting corundum structure constitutes however a big challenge, in particular because of the polymorphic character of $Al_2O_3$.

The use of coatings formed of corundum type $(Al,Cr)_2O_3$ solid solutions instead of α-$Al_2O_3$ coatings has been proved to be a promising alternative for coating machining tools in the last years. The main reasons are probably that:

- Cr forms an isostructural α-type $Cr_2O_3$ with similar lattice parameters like α-$Al_2O_3$ and a certain miscibility with α-$Al_2O_3$,
- α-type $Cr_2O_3$ can be easily formed by using PVD processes, and
- it is possible to promote growing of metastable corundum type $(Al,Cr)_2O_3$ solid solutions films at process temperatures between 500° C. and 600° C. by using PVD processes and in particular by using CAE A clear drawback of using the above mentioned metastable corundum type $(Al,Cr)_2O_3$ solid solutions films is however that during machining operations, in which the coated tools are subjected to high temperatures, undesired phases are generally formed, in particular when the Al mole fraction in the corundum type $(Al,Cr)_2O_3$ solid solutions film is higher than 50% (i.e. x>0.5) and the film has been produced by PVD at a low temperature (e.g. between 500° C. and 600° C.).

Objective of the Present Invention

The main objective of the present invention is to provide a method for forming an Al—Cr-based coating on a substrate surface, which exhibits thermal stability at high temperatures.

DESCRIPTION OF THE PRESENT INVENTION

The objective of the present invention may be attained by providing a coating with an Al—Cr—O—N film—hereinafter also referred to as multilayer film—exhibiting a multilayer structure, which comprises a plurality of individual layers of type A made of Al—Cr—O—N and a plurality of layers of individual layers of type B made of Al—Cr—N, wherein the individual layers of type A are deposited alternate regarding the individual layers of type B, so that each one of the individual layers of type A is deposited between two individual layers of type B or each individual layer of type B is deposited between two individual layers of type A forming a multilayered structure with following sequence of individual layers is formed: . . . B/A/B/A/B/A/B/A/B/A/B . . . . The relation between O content and N content in average in the Al—Cr—O—N film with multilayer structure correspond to a ratio of O:N having a value between and including 1.8 and 4, preferably having a value between and including 2 and 3. This ratio is the quotient of dividing the average content of O in atomic percentage in the Al—Cr—O—N film by the average content of N in atomic percentage in the Al—Cr—O—N film, when only the content of O and the content of N are taken into account for the calculation. It means by normalizing the content of O in atomic percentage and the content of N in atomic percentage in such a manner that the sum of the content of O and the content of N gives 100 at. %.

According to a further preferred embodiment of the present invention the Al—Cr—O—N film is produced comprising additionally individual layers of the type C made of Al—Cr—O, in such a manner that a multilayered structure with following sequence of individual layers is formed: . . . B/A/C/A/B/A/C/A/B/A/C/A/B . . . .

Coatings according to the present invention comprising:
one or more Al—Cr—O—N films with multilayered structure with sequence of individual layers of the type . . . B/A/B/A/B/A/B/A/B . . . , or
one or more Al—Cr—O—N films with multilayered structure with sequence of individual layers of the type . . . B/A/C/A/B/A/C/A/B/A/C/A/B . . . , or
one or more Al—Cr—O—N films with multilayered structure with sequence of individual layers of the type . . . B/A/B/A/B/A/B/A/B . . . and one or more Al—Cr—O—N films with multilayered structure with sequence of individual layers of the type . . . B/A/C/A/B/A/C/A/B/A/C/A/B . . . .

exhibit an astonishing resistance to decomposition of phases present in the A and B layers and as the case may be in the A, B and C layers of the Al—Cr—O—N film.

The inventors have also produced coatings according to the present invention comprising further layers, e.g. Cr-containing layers, deposited between the substrate and the Al—Cr—O—N film present in the coating, or in the case that more than one Al—Cr—O—N film are present in the coating, then between the substrate and the Al—Cr—O—N film deposited nearest to the substrate or between two different Al—Cr—O—N films. Very surprisingly, the inventors have observed that also a prevention to decomposition of phases present in these further layers, in particular in Cr-containing layers, may be attained.

It seems to be that the one or more Al—Cr—O—N films present in coatings according to the present invention may act as barrier for diffusion of O and also as barrier for diffusion of Cr in the coating. Thereby preventing diffusion of coating constituents and mass loss at high temperatures (e.g. diffusion of Cr and loss of Cr caused by formation of volatile Cr—O compounds at the coating surface).

According to one more preferred embodiment of the present invention, the coating comprises one Al—Cr—O—N films deposited forming the outermost surface of the coating.

Coatings according to the present invention, in particular the one or more Al—Cr—O—N films comprised in the coatings, are preferably produced by means of a physical vapor deposition (PVD) method.

Any PVD method can be suitable for producing the inventive coatings. For example cathodic arc vaporization or cathodic sputtering, including also the sputtering variant called high-power impulse magnetron sputtering (HIPIMS) that is also called high power pulsed magnetron sputtering (HPPMS).

However the deposition of coatings according to the present invention is not limited exclusively to the above mentioned methods.

For attaining a higher thermal stability and better mechanical properties at high temperatures, the layers of type A should comprise Al and Cr in respective concentrations which result in a relation between Al content and Cr content in the A layer that can be expressed as a ratio of Al:Cr having a value between and including 1.5 and 4. This ratio is the quotient of dividing the content of Al in atomic percentage in the A layer by the average content of Cr in atomic percentage in the A layer, when only the content of Al and the content of Cr are taken into account for the calculation. It means by normalizing the content of Al in atomic percentage and the content of Cr in atomic percentage in such a manner that the sum of the content of Al and the content of Cr gives 100 at. %.

In the case that only A and B layers are comprised in the Al—Cr—O—N film, then preferably, for attaining higher thermal stability and better mechanical properties at high temperatures, both the layers of type A and the layers of type B have to be produced having an Al content and a Cr content as mentioned above for the A layers.

In the case that C layers are further comprised in the Al—Cr—O—N film, then preferably, for attaining higher thermal stability and better mechanical properties at high temperatures, the three type of layers, namely the A, B and C layers have to be produced having an Al content and a Cr content as mentioned above for the A layers.

In such two last cases, the relation between Al content and Cr content in average in the Al—Cr—O—N film with multilayer structure should correspond to a ratio of Al:Cr having a value between and including 1.5 and 4. This ratio is the quotient of dividing the average content of Al in atomic percentage in the Al—Cr—O—N film by the average content of Cr in atomic percentage in the Al—Cr—O—N film, when only the content of Al and the content of Cr are taken into account for the calculation. It means by normalizing the content of Al in atomic percentage and the content of Cr in atomic percentage in such a manner that the sum of the content of Al and the content of Cr gives 100 at. %. These above mentioned restrictions of the Al and Cr concentration include for example the case that the concentration of Al is of 70 at. % and the concentration of Cr is of 30 at. %, in such a case the ratio Al:Cr is of approximately 2.33.

According to a further preferred embodiment of the present invention, the B layers of the one or more Al—Cr—O—N films comprised in the coating can be produced as Al—Cr—N layers comprising a small concentration of oxygen, which does not exceed 10 at. %, when only the content of N and the content of O present in the B layer are taken into account for the calculation. It means when the content of Al in atomic percentage and the content of Cr in atomic percentage are normalized in such a manner that the sum of the content of Al and the content of Cr gives 100 at. %.

For PVD deposition of the monolayer Al—Cr—O—N film and also for PVD deposition of the multilayer Al—Cr—O—N film in a vacuum coating chamber, one or more targets comprising aluminum and chromium in the solid phase can be used as material source for supplying aluminum and chromium for the formation of the Al—Cr—O—N layers. Likewise an oxygen gas flow and a nitrogen gas flow can be introduced as reactive gases in the vacuum coating chamber for supplying oxygen and nitrogen for the formation of the Al—Cr—O—N layers. Optionally a flow of one or more inert gases (e.g. argon) can be also introduced in the vacuum coating chamber as work gas in known manner for a person skilled in the art, for example for improving process stability or adjusting coating parameters.

The one or more targets can be operated as cathode in order to bring target material from the solid phase to the vapor phase, for example by using arc vaporization techniques or by using any sputtering technique.

In this manner the Al—Cr—O—N layers can be formed by operating the targets in a reactive atmosphere comprising oxygen and nitrogen in the interior of the vacuum coating chamber.

For the deposition of the multilayer Al—Cr—O—N film, the oxygen gas flow and the nitrogen gas flow can be varied for forming the type A layers and the type B layers, respectively.

The nitrogen partial pressure can be reduced for producing the type A layers and increased for producing the type B layers, thereby being formed type A layers comprising a lower nitrogen content than the type B layers.

In the context of the present invention, the one or more targets comprising aluminum and chromium, mentioned above, are targets comprising aluminum and chromium as main components.

The targets comprising aluminum and chromium are preferably targets made of aluminum and chromium. The term 'targets made of aluminum and chromium' in the context of the present invention refers to targets consisting of aluminum and chromium but which can also comprise unavoidable impurities.

For producing the above mentioned nitride B layers without comprising oxygen or practically without comprising oxygen, the inventors recommend to reduce the oxygen gas flow during deposition of the multilayer film until the oxygen gas flow is completely interrupted or almost completely interrupted. In the context of the present invention the term 'almost completely interrupted' is to be understood as a term for referring to a negligible remaining gas flow, which practically does not contribute to the formation of the nitride B layers. In other words, the number of oxygen molecules is so small in comparison to the number of nitrogen molecules that the negligible remaining oxygen gas flow, if at all, leads just to traces of impurities within the nitride B layers.

Since crystallographic cubic phase is known to produce better mechanical properties, the inventors recommend to select further coating parameters, such as process temperature, total gas pressure in the coating chamber, power density or current density at the target or targets used as material source, bias voltage applied at the substrates to be coated, etc. in known manner by a person skilled in the art for producing crystallographic cubic phase of the Al—Cr—O—N film.

The present invention further discloses:

A method as described above, wherein the multilayer film comprises furthermore individual layers of the type C, deposited as oxide layers by reducing the nitrogen gas flow and by increasing the oxygen gas flow, thereby forming oxide layers of Al—Cr—O, which are formed deposited in each case between one A layer and one B layer or between one B layer and one A layer forming a multilayered structure with sequence of individual layers B/A/C/A/B/A/C/A/B/A . . . .

A method as described above, wherein the A layers are deposited as gradient layers with variable content of nitrogen and oxygen, wherein A layers deposited on B layers exhibit increasing oxygen content and decreasing nitrogen content along its individual thickness in direction to the outermost surface of the multilayer film, and wherein A layers deposited on C layers exhibit increasing nitrogen content and decreasing oxygen content along its individual thickness in direction to the outermost surface of the multilayer film.

A method as described in any of the above mentioned embodiments, wherein the multilayer film is deposited having bilayer period corresponding to the quantity of pairs of A and B layers comprised in the multilayer film that is equal to or higher than 12, preferably having bilayer period is equal to or higher than 25, more preferably having bilayer period is equal to or higher than 50.

A turbine component coated with a coating comprising a multilayer film deposited by using any of the above mentioned methods.

A steam turbine coated with a coating comprising a multilayer film deposited by using any of the above mentioned methods.

A gas turbine coated with a coating comprising a multilayer film deposited by using any of the above mentioned methods.

A component of a combustion engine coated with a coating comprising a multilayer film deposited by using any of the above mentioned methods.

Particular Advantages Provided by the Present Invention

The present invention is particularly advantageously in comparison with the state of the art at least because it makes possible to attain:
increased resistance against mass loss initiated by decomposition of Al—Cr—N to W—AlN and h-Cr$_2$N at high temperatures above 1000° C.,
improved oxygen barrier properties for Al—Cr—O—N coatings,
higher structural stability of Al—Cr-based coatings up to 1500° C., in comparison with similar coatings, in which Cr diffusion occurs.

In order to ensure the above mentioned advantages, the thickness of the Al—Cr—O—N film present in coatings according to the present invention should be ≥0.5 μm.

According to a preferred embodiment of the present invention the Al—Cr—O—N film is deposited having a thickness ≥1 μM.

EXAMPLES FOR EXPLAINING THE PRESENT INVENTION IN MORE DETAIL

Some examples will be mentioned in the following part of the description of the present invention in order to facilitate the understanding of the invention. With this purpose, the FIG. 1 and FIG. 2 will be referred in the description.

FIG. 1: Schematic illustration of multilayer films comprising B individual layers (hereafter also referred to as nitride layers, e.g. made of Al—Cr—N), and C individual layers (hereafter also referred to as oxide layers, e.g. made of Al—Cr—O), deposited alternate one of each other. The multilayer film presenting three different kinds of interfaces between the nitride layers and the oxide layers: blurred interfaces, hybrid interfaces and distinct interfaces, wherein the blurred interfaces are produced forming the A layers, e.g. made of Al—Cr—O—N. FIG. 1 shows also the interface volume fractions, which were classified qualitatively as low, medium, and high, established with multilayered structures comprising Al—Cr—N layers as nitride layers and Al—Cr—O layers as oxide layers. As it is shown in FIG. 1, the multilayer films (or also called multilayer coatings in the present description) formed having blurred interfaces are considered to have a higher interface volume fraction than the multilayer films formed having distinctive interfaces or hybrid interfaces, because the blurred interfaces occupy a longer extension of the coating along the total thickness of the multilayer film. In this regard, it is also important to take into account also that a higher quantity of bilayers in the multilayer film results in the presence of more interfaces in the multilayer films, which also results in a higher interface volume fraction within the multilayer film. Consequently a combination of a higher quantity of bilayers and the formation of blurred interfaces in the multilayer film results in an ever higher interface volume fraction within the multilayer film.

Figure 2:
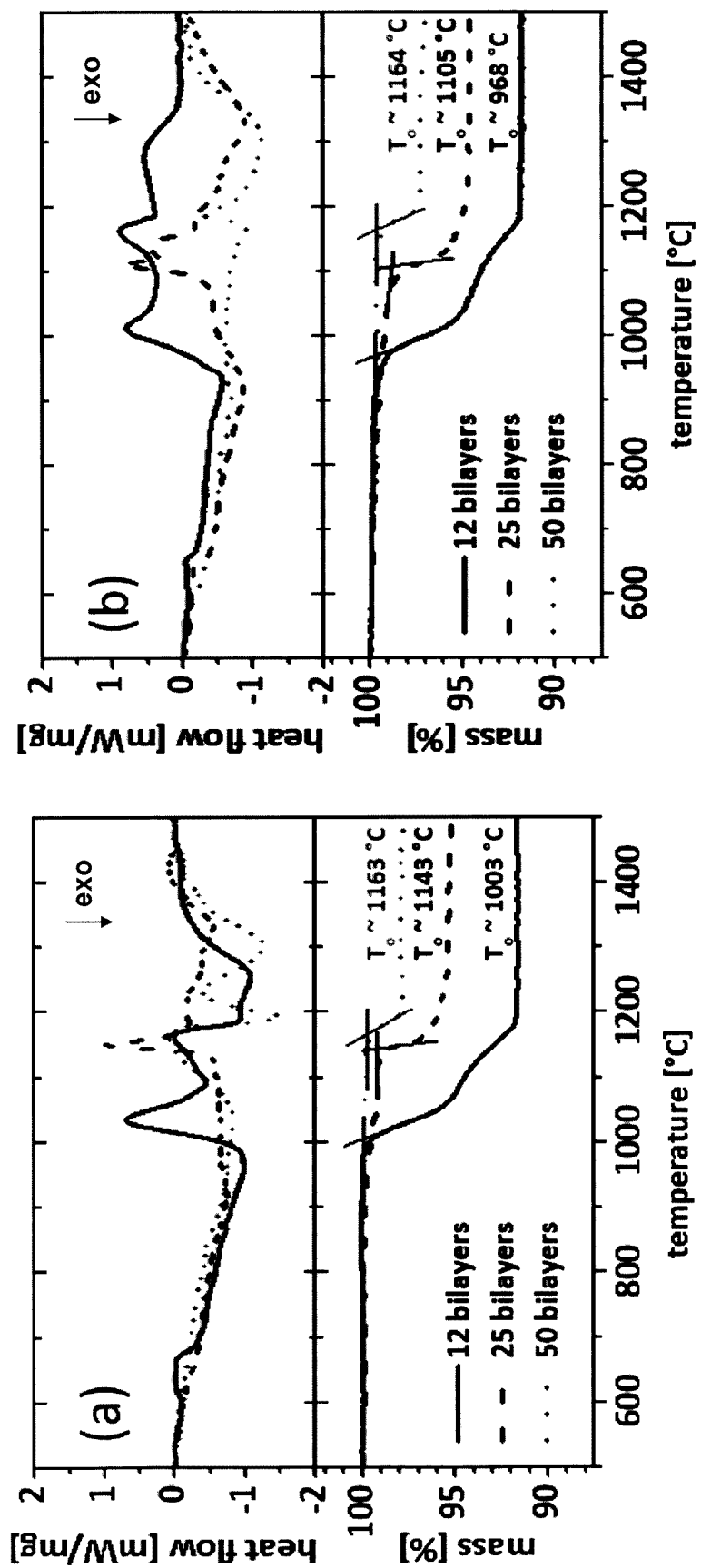
Figure 2:
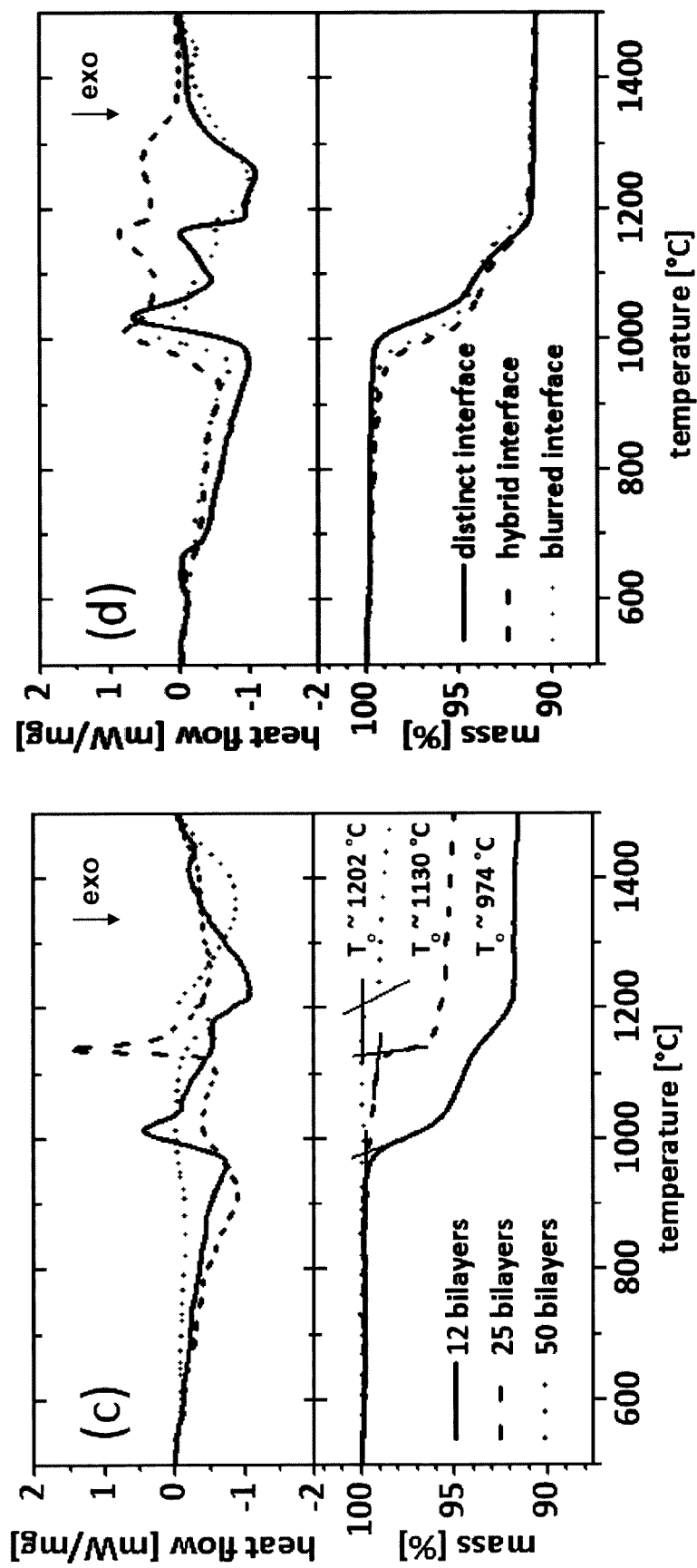
Figure 2:
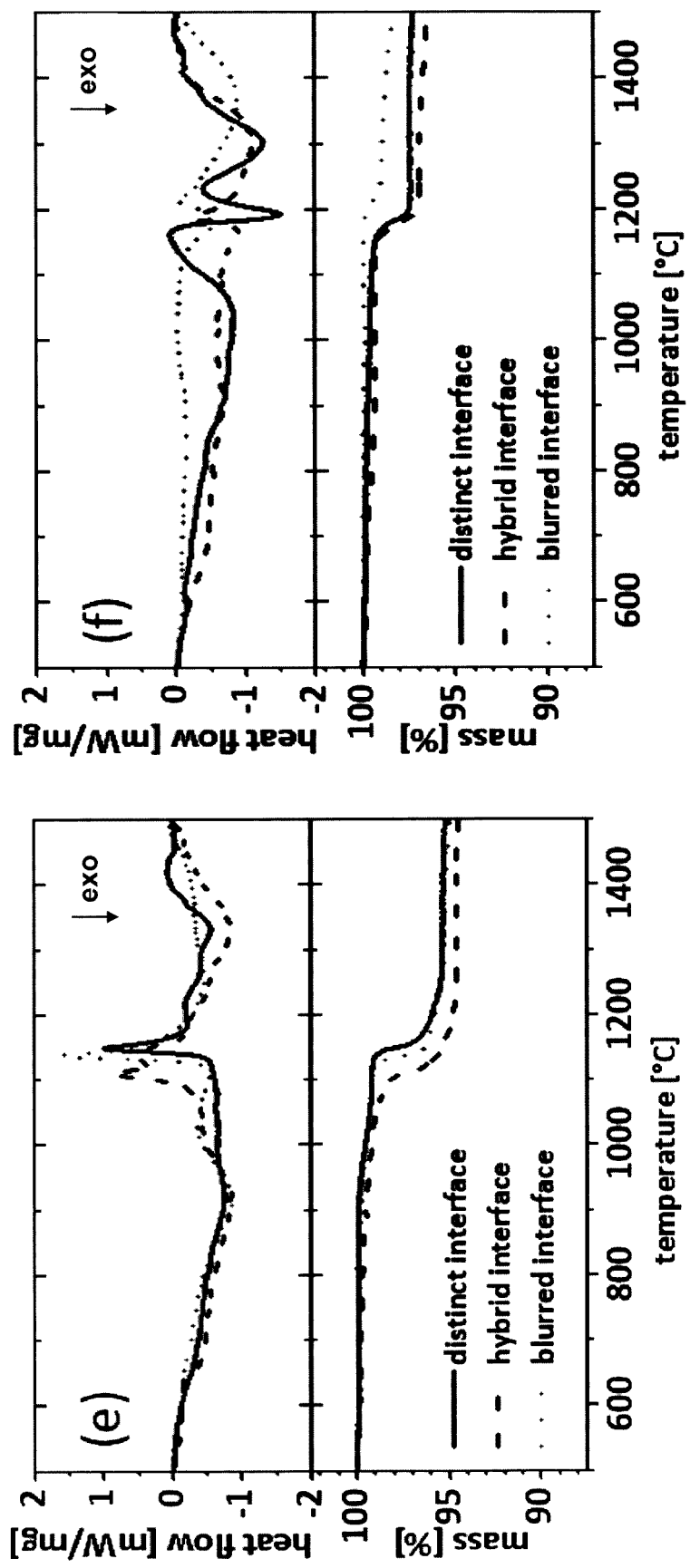

FIG. 2: DSC and TGA signals of multilayer films comprising nitride individual layers as B layers made of Al—Cr—N and oxide individual layers as C layers made of Al—Cr—O, deposited alternate one of each other. The multilayer film presenting three different kinds of interfaces between the nitride layers and the oxide layers: blurred interfaces, hybrid interfaces and distinct interfaces, wherein the blurred interfaces are produced forming layers of type A made of Al—Cr—O—N. FIGS. 2(a), (b), and (c) show the impact of the volume fraction (12, 25, or 50 bilayers) for distinct, hybrid, and blurred nitride-oxide interfaces, respectively. FIGS. 2(d), (e) and (f) show the impact of the architecture (distinct, blurred, and hybrid) for 12, 25, and 50 bilayers, respectively.

For the deposition of the inventive coatings comprising multilayer films produced according to the present invention, a coating device of the type Innova of Oerlikon Balzers was used. The coating machine was equipped with a cathodic arc evaporation system. Powder metallurgically (PM) manufactured targets were used as cathode material.

In particular, for the examples described below cathode material (targets) made of aluminum and chromium, having element composition in atomic percentage corresponding to 70% aluminum and 30% chromium, were used. These targets were manufactured by Plansee Composite Materials GmbH.

Different kinds of substrate materials were coated for the experiments, e.g. low-alloyed steel foil (for DSC and TGA) and Si (100) for EDS compositional analysis. The substrates were ultrasonically cleaned in acetone and ethanol for 10 minutes and then mounted on a two-fold rotation carousel with a minimum target-to-substrate distance of approximately 25 cm.

In the following a process description is given and an explanation of the different types of interfaces synthesized in the experiments. The deposition chamber was heated by a combined radiation and plasma heating process for approximately 30 minutes in order to attain a process temperature of 500° C.

Argon ion etching was performed for another 30 minutes, in order to remove any contaminations and oxides from the substrate surfaces to be coated.

The multilayer architecture of the coatings was realized by alternatively operating two out of 170 four active neighboring cathode positions in nitrogen and oxygen atmosphere, respectively. In detail, the individual nitride layers were synthesized with an arc current of 150 A and a nitrogen flow rate of 1100 sccm, whereas for the oxide layers the other two cathodes were operated at 180 A with an oxygen flow rate of 1000 sccm injected to the cathode surface. The average deposition pressure of the individual nitride and oxide layers was ~3.6 Pa and ~2.6 Pa, respectively. In order to enhance growth kinetics, a negative bipolar pulsed substrate bias of −40 V was applied. Variation in the bilayer period, thus overall interface fraction, was realized by reducing the active source times from 145, 60, to 30 s, resulting in 12, 25, and 50 bilayers [i.e., 24, 50, and 100 layers (nitrides and oxides)] in total. In addition, three different interface types, (referred to as distinct, hybrid, and blurred) were established by adjusting the gas-exchange between nitrogen and oxygen as shown in FIG. 1, in combination of switching—on and—off of the corresponding two cathodes. For all coating variations, the process started in nitrogen atmosphere, although also the start with an oxide layer can be realized.

An overlapping gas-exchange between oxygen and nitrogen after the active source times (of 145, 60, and 30 s for the deposition of the multilayered structures with 12, 25 and 50 bilayers, respectively) after which two operating cathodes (nitride deposition) are switched off and simultaneously the other two cathodes (oxide deposition) are ignited—and vice versa—leading to the formation of blurred interfaces forming Al—Cr—O—N layers (A layers) between the nitride layers (B layers) and the oxide layers (C layers). A distinct transition between the individual nitride and oxide layers was realized by switching off all sources until the gas exchange was completed (this takes about 37 s in the machine), before the corresponding targets were ignited again. For the hybrid 190 interface type, both process schemas are combined, where the transition from nitride to oxide layers is blurred (i.e. forming A layers made of Al—Cr—O—N), but the transition from oxide to nitride layers is distinct (without forming A layers made of Al—Cr—O—N), as indicated in FIG. 1.

Multilayer films were deposited by cathodic arc evaporation of $Al_{0.7}Cr_{0.3}$ targets, which were operated as cathodes at a respective constant arc current in an atmosphere comprising nitrogen gas and oxygen gas with variable nitrogen partial pressure for the formation of the respective A layers, B layers and C layers. The flow of oxygen gas was completely interrupted in the cases, in which B layers (without oxygen) needed to be produced.

In some inventive examples, the individual B layers (also referred to as nitride layers in the present description) were synthesized by operation of four targets as cathodes with an arc current of 150 A, and a nitrogen flow rate of 1100 sccm that was injected to the respective cathode surfaces, whereas for the deposition of the individual C layers (also referred to as oxide layers in the present description) other two targets were operated as cathodes at 180 A, with an oxygen flow rate of 1000 sccm that was also injected to the respective cathode surfaces. In the cases, in which between the deposition of the B layers and the deposition of the C layers both nitrogen gas and oxygen gas were present in the vacuum coating chamber of the coating device and also the targets were maintained active, resulting in the formation of layers consisting essentially of Al—Cr—O—N. The term "consisting essentially of Al—Cr—O—N" is used in this context for referring to a material that consists of aluminum, chromium, oxygen and nitrogen but can also comprise unavoidable impurities.

In order to enhance growth kinetics, a negative bipolar pulsed substrate bias of −40 V was applied to the substrate holder. For the synthesis of the Al—Cr—O—N coatings, a bias typically in the range of 20 kHz can be utilized because the coatings have still a certain electrical conductivity despite the high concentration of oxygen in the coatings.

The bilayer period was varied by varying the quantity of individual B layers and C layers along the overall thickness of the multilayer film.

This variation can for example be attained by using different active source times. In the present context active source time is referred to the time, during which a target is being actively operated as cathode. It is of course not the only one manner of varying bilayer periods in multilayer coatings.

For the analysis of thermal stability, multilayer films comprising 12, 25, and 50 bilayers (i.e., 24, 50, and 100 individual layers) were deposited. The overall thickness of the multilayer films in all cases was about 4 μm.

The thermal stability of the coatings was investigated by a combination of differential scanning calorimetry (DSC) and thermal gravimetric analysis (TGA) using a DSC-STA 449 F1 Jupiter®, calibrated with 7 elements (In, Sn, Bi, Zn, Al, Ag, Au). The measurements were carried out with a heating rate of 20 K/min up to 1500° C. in a dynamic He atmosphere (protective=50 ml/min; purge=50 ml/min).

Chemical and morphological investigations of the coatings were carried out using a FEI Quanta 200 field emission gun scanning electron microscope (FEG SEM) with an EDAX energy dispersive X-ray spectroscopy (EDS) detector attached.

Information on the crystallographic composition was obtained by X-ray diffraction (XRD) in a Bragg-Brentano arrangement (BB: 2θ=15-90°) for annealed powder samples.

The results of the compositional EDS analysis is shown in Table 1 for the distinct and blurred interfaces between the bilayers. The ratio between the metallic constituents of the coating is very near to the original metallic composition of the target which consists of 70 at. % Al and 30 at. % Cr. However, surprisingly is the strong increase of the oxygen content with the number of the bilayers despite the fact that for all coatings the same oxygen and nitrogen flows were utilized. The percentage of oxygen increases for both distinct as well as blurred interfaces from an overall multilayer percentage of about 70% for 12 bilayers to an overall percentage of 82 to 83% for 50 bilayers.

TABLE 1

Elemental composition of (Al, Cr)N/(Al, Cr)$_2$O$_3$ multilayers obtained by SEM-EDS.
interface architecture elemental composition
[at. %] Al/(Al + Cr) O/(N + O)

| | [bilayers] | Al | Cr | N | O | [%] | [%] |
|---|---|---|---|---|---|---|---|
| distinct | 12 | 27.1 | 13.3 | 18.5 | 41.2 | 67.1 | 69.0 |
| | 25 | 25.5 | 12.4 | 15.4 | 46.7 | 67.3 | 75.2 |
| | 50 | 25.0 | 12.2 | 11.2 | 51.6 | 67.2 | 82.1 |
| blurred | 12 | 26.6 | 12.0 | 18.7 | 42.7 | 68.8 | 69.6 |
| | 25 | 26.4 | 11.9 | 12.8 | 49.0 | 69.0 | 79.3 |
| | 50 | 25.7 | 12.3 | 10.3 | 51.7 | 67.7 | 83.4 |

The following DSC, TGA and XRD analysis was performed to investigate the influence of the increased oxygen content in the multilayer coatings on their thermal stability.

FIG. 2 shows the DSC signals and the corresponding mass changes as a function of the annealing temperature for our (Al,Cr)N/(Al,Cr)$_2$O$_3$ multilayer coatings. Thereby, FIGs. 2a, b, and c show a categorization of the deposited and investigated multilayer coatings according to their different kind of interfaces, while FIGS. 2d, e and f show the categorization according to their interface fraction.

The exo- and endothermic reactions in the heat flow signal as well as the corresponding mass loss of the multi-layered structures with 12 bilayers and distinct interface-type is shown in FIG. 2a and/or FIG. 2d. The exothermic DSC features in the range of 650-1000° C. stem from recovery and relaxation processes of deposition-induced defects. The pronounced as well as the less intense endothermic features with peak maxima at 1034° C. and 1162° C. can be assigned to the dissociation of Cr—N bonds. CrN transforms into h-Cr2N under the release of N2 in first place and with higher annealing temperature Cr2N further dissociates to Cr. This two-stage decomposition is represented by the corresponding TGA signal (onset temperature, To~1000° C.). The difference in the slope of the TGA curve between 1000-1200° C. stems from the different bonding character of nitrogen in cubic CrN and hexagonal Cr2N. Exothermic DSC features detected between 1170 and 1330° C. may be related to grain growth, recrystallization, and/or sinter processes. This means that for all the Al—Cr—O—N multi-layer coatings, Cr is released from the coating via two step reactions.

The TGA spectra of the multilayer coatings with 25 and 50 bilayers (distinct interface-type, FIG. 2a, indicated by dashed and dotted lines, respectively) exhibit a slightly higher onset temperature for decomposition (To25~1140° C. and To50~1160° C., respectively). The two-step mass loss, which was for the multilayer coating with 12 bilayers and distinct interfaces quite pronounced, turned into an almost continuous one-stage process. The corresponding DSC signals show a similar behavior. In the case of the 25 bilayers, the first exothermic reactions occur between 600 and 1120° C., while the peak maximum of the first endothermic reaction is shifted to 1145° C. The second endothermic reaction (1175-1250° C.) in which Cr2N dissociates into Cr under N2 release, indicated by corresponding decreasing mass signals, is superimposed by exothermic reactions taking place in the same temperature range. The increasing number of bilayers—hence increasing number of interfaces and in particular the increasing number of oxide layers—may act as diffusion barriers against the diffusion of nitrogen and chromium.

The TGA data of the multilayer coatings consisting of 50 bilayers with distinct interfaces (FIG. 2a, dotted lines) demonstrate only a minor mass loss at To~1160° C., which can be associated with the release of N2. Apart from the corresponding superimposed endothermic feature, the DSC signal exhibits three major exothermic features. Between 500 and 1130° C. recovery and relaxation processes take place. The second exothermic reaction with a peak maximum at 1190° C. can be ascribed to the formation of α-Al$_2$O$_3$, as evident from XRD analysis, while in the temperature range of 1240-1450° C. sintering is most likely—which is also substantiated by the powder composition after the DSC measurements. The trend of an increasing thermal stability of the multilayer coatings due to the retarded dissociation of Cr—N bindings, as well as the retarded formation of α-Al$_2$O$_3$ with increasing number of bilayers (interface volume) can be observed independently of the interface type/interface geometry, see FIG. 2a-c. However, in absolute terms there is of course a difference in the DSC and TGA signals, as can be seen in FIG. 2d-f. The DSC and the TGA signals of the multilayer coatings with 12 bilayers and hybrid and/or blurred interface geometries demonstrate a shift to lower temperatures of the first endothermic feature to lower temperatures (at ~1010° C.) as well as the onset temperature of the mass loss (To ~970° C.) compared to the multilayer with distinct interfaces, see FIG. 2d. In the case of blurred interfaces the oxide layers exhibit a rather underdense and columnar structure, which in turn represent coating areas which are susceptible for easier diffusion of nitrogen. The total mass loss of 9.1% is the same for all three interface geometries.

For multilayers with 25 bilayers in total, see FIG. 2e, the blurred and distinct interface geometry lead to almost identical DSC and TGA signals with one pronounced endothermic heat flow feature at ~1140° C. and an almost identical mass loss of ~4.8 wt. %, separated only by ~10° C. The multilayer consisting of hybrid interfaces exhibits two resolvable endothermic features with peak maxima at 1110 and 1135° C., respectively. The mass signal indicates a total mass loss of 5.4 wt. % beginning with To~1105° C., thus around 35° C. lower than observed for other interface geometries.

The influence of the interface geometry in the multilayer coatings with 50 bilayers can be seen in FIG. 2f. Here, the TGA signals of all three interface types suggest only for a one-stage mass loss. The retarded dissociation of Cr2N into Cr via N2 release can be explained by the higher interface fraction within these multilayers, effectively acting as diffusion barriers. This is in agreement with the corresponding DSC signals, which demonstrate only small endothermic features additionally superimposed by more intense exothermic reactions. The onset temperature To~1165° C. of the mass loss is identical for the multilayers with hybrid and distinct interfaces, while the beginning of the mass loss for the blurred interface geometry is shifted to ~1200° C. There is also a difference in the total mass loss obtainable. The total mass loss values are 3.4, 2.7, and 1.6 wt. %, for the multilayers with hybrid, distinct, and blurred interfaces, respectively.

In summary, the mass loss decreases significantly with increased volume fraction of interfaces and especially pronounced for the blurred-type nitride-oxide interfaces (i.e., from 12 to 25 to 50 bilayers).

Therefore, the multilayer coatings with 50 bilayers and blurred interfaces (dotted lines in FIG. 2 c or/and FIG. 2f) exhibit the highest thermal stability.

Therefore the increasing number of bilayers up to 50 in general and the blurred interface geometry in specific, increases the thermal stability of the multi-layered coatings enormously. One reason for this could be the increased oxygen incorporation in the case of the blurred interface design. Multilayer films with such kind of multilayer structures provided as coatings or as film within a coating according to the present invention are considered to have an increased (high) interface volume fraction in the context of the present invention.

The present invention discloses in particular:

A method for producing a multilayer film comprising aluminum, chromium, oxygen and nitrogen, in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:

The A layers are deposited as oxynitride layers of Al—Cr—O—N by using nitrogen and oxygen as reactive gas at the same time, The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

A method as described directly above, wherein the multilayer film comprises furthermore individual layers of the type C, deposited as oxide layers by reducing the nitrogen gas flow and by increasing the oxygen gas flow, thereby forming oxide layers of Al—Cr—O, which are formed deposited in each case between one A layer and one B layer or between one B layer and one A layer forming a multilayered structure with sequence of individual layers B/A/C/A/B/A/C/A/B/A . . . .

A method as described directly above, wherein the A layers are deposited as gradient layers with variable content of nitrogen and oxygen, wherein A layers deposited on B layers exhibit increasing oxygen content and decreasing nitrogen content along its individual thickness in direction to the outermost surface of the multilayer film, and wherein A layers deposited on C layers exhibit increasing nitrogen content and decreasing oxygen content along its individual thickness in direction to the outermost surface of the multilayer film.

A method as described in any of the above mentioned embodiments, wherein the multilayer film is deposited having bilayer period corresponding to the quantity of pairs of A and B layers comprised in the multilayer film that is equal to or higher than 12, preferably having bilayer period is equal to or higher than 25, more preferably having bilayer period is equal to or higher than 50.

A turbine component coated with a coating comprising a multilayer film deposited by using any of the above mentioned methods.

A steam turbine coated with a coating comprising a multilayer film deposited by using any of the above mentioned methods.

A gas turbine coated with a coating comprising a multilayer film deposited by using any of the above mentioned methods.

A component of a combustion engine coated with a coating comprising a multilayer film deposited by using any of the above mentioned methods.

The invention claimed is:

1. A method for producing a multilayer film comprising aluminum, chromium, oxygen and nitrogen, in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:

The A layers are deposited as oxynitride layers of Al—Cr—O—N by using nitrogen and oxygen as reactive gas at the same time, The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

2. The method according to claim 1, wherein the relation between oxygen content and nitrogen content in the multilayer film correspond to a ratio in atomic percentage having a value between and including 2 and 3.

3. The method according to claim 1, wherein the flow of oxygen gas is completely interrupted in order to produce the B layers.

4. The method according to claim 1, wherein the B layers of the one or more Al—Cr—O—N films comprised in a coating can be produced as Al—Cr—N layers comprising a concentration of oxygen, which does not exceed 10 at. %.

5. The method according to claim 1, wherein the coating comprises one Al—Cr—O—N film deposited forming the outermost surface of the coating.

6. The method according to claim 1, wherein the used PVD technique comprises cathodic arc vaporization or cathodic sputtering.

7. The method according to claim 1, wherein the layers of type A comprise Al and Cr in concentrations which result in a relation between Al content and Cr content in the A layer that can be expressed as a ratio of Al:Cr having a value between and including 1.5 and 4.

8. The method according to claim 1, wherein the layers of type B comprise Al and Cr in concentrations which result in a relation between Al content and Cr content in the B layer that can be expressed as a ratio of Al:Cr having a value between and including 1.5 and 4.

9. The method according to claim 1, wherein the multilayer film comprises further layers.

10. The method according to claim 9, wherein the further layers are deposited between the substrate and the Al—Cr—O—N film or between the substrate and the Al—Cr—O—N film deposited nearest to the substrate or between two different Al—Cr—O—N films.

11. The method according to claim 1, wherein the multilayer film comprises furthermore individual layers of the type C, deposited as oxide layers by reducing the nitrogen gas flow and by increasing the oxygen gas flow, thereby forming oxide layers of Al—Cr—O, which are formed deposited in each case between one A layer and one B layer or between one B layer and one A layer forming a multilayered structure with sequence of individual layers B/A/C/A/B/A/C/A/B/A . . . .

12. The method according to claim 11, wherein the A layers are deposited as gradient layers with variable content of nitrogen and oxygen, wherein A layers deposited on B layers exhibit increasing oxygen content and decreasing nitrogen content along its individual thickness in direction to the outermost surface of the multilayer film, and wherein A layers deposited on C layers exhibit increasing nitrogen content and decreasing oxygen content along its individual thickness in direction to the outermost surface of the multilayer film.

13. The method according to claim 11, wherein the layers of type C comprise Al and Cr in concentrations which result in a relation between Al content and Cr content in the C layer that can be expressed as a ratio of Al:Cr having a value between and including 1.5 and 4.

14. The method according to claim 1, wherein the thickness of the multilayer film is ≥0.5 μm.

15. The method according to claim 1, wherein the thickness of the multilayer film is ≥1 μm.

16. The method according to claim 1, wherein a flow of one or more inert gases can be introduced in the vacuum coating chamber as work gas.

17. The method according to claim 1, wherein the multilayer film is deposited having a bilayer period corresponding to the quantity of pairs of A and B layers comprised in the multilayer film that is equal to or higher than 12.

18. The method according to claim 17, wherein the bilayer period is equal to or higher than 25.

19. The method according to claim 17, wherein the bilayer period is equal to or higher than 50.

20. A turbine component coated with a coating comprising a multilayer film, comprising aluminum, chromium, oxygen and nitrogen, produced by a method for producing a multilayer film in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:
  The A layers are deposited as oxynitride layers of Al—Cr—O—N by using nitrogen and oxygen as reactive gas at the same time,
  The B layers are deposited as nitride layers of Al—Cr—N by reducing the oxygen gas flow and by increasing the nitrogen gas flow in order to use only nitrogen as reactive gas for the formation of the Al—Cr—N layer, and
wherein the relation between oxygen content and nitrogen content in the multilayer film correspond to a ratio in atomic percentage having a value between and including 1.8 and 4.

21. A steam turbine coated with a coating comprising a multilayer film, comprising aluminum, chromium, oxygen and nitrogen, deposited by using a method for producing a multilayer film in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:
  The A layers are deposited as oxynitride layers of Al—Cr—O—N by using nitrogen and oxygen as reactive gas at the same time,
  The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

22. A gas turbine coated with a coating comprising a multilayer film, comprising aluminum, chromium, oxygen and nitrogen, deposited by using a method for producing a multilayer film in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:
  The A layers are deposited as oxynitride layers of Al—Cr—O—N by using nitrogen and oxygen as reactive gas at the same time,
  The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

23. A component of a combustion engine coated with a coating comprising a multilayer film, comprising aluminum, chromium, oxygen and nitrogen, deposited by using a method for producing a multilayer film in a vacuum coating chamber, the multilayer film comprising individual layers of type A and individual layers of type B deposited alternate one of each other forming a multilayered structure with sequence of individual layers B/A/B/A/B/A . . . , wherein during deposition of the multilayer film at least one target comprising aluminum and chromium is operated as cathode by means of a PVD technique and used in this manner as material source for supplying aluminum and chromium, and an oxygen gas flow and a nitrogen gas flow are introduced as reactive gases in the vacuum chamber for reacting with aluminum and chromium, thereby supplying oxygen and nitrogen for forming the multilayer film, wherein:

The A layers are deposited as oxynitride layers of Al—Cr—O—N by using nitrogen and oxygen as reactive gas at the same time, The B layers are deposited as nitride layers of Al—Cr—N by reducing the oxygen gas flow and by increasing the nitrogen gas flow in order to use only nitrogen as reactive gas for the formation of the Al—Cr—N layer, and wherein the relation between oxygen content and nitrogen content in the multilayer film correspond to a ratio in atomic percentage having a value between and including 1.8 and 4.

* * * * *